US007652385B2

(12) United States Patent
Kuramoto (10) Patent No.: US 7,652,385 B2
(45) Date of Patent: Jan. 26, 2010

(54) SEMICONDUCTOR DEVICE AND METHOD OF MANUFACTURING THE SAME

(75) Inventor: Kazunori Kuramoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/180,597

(22) Filed: Jul. 28, 2008

(65) Prior Publication Data

US 2009/0026589 A1 Jan. 29, 2009

(30) Foreign Application Priority Data

Jul. 26, 2007 (JP) ............................... 2007-194127

(51) Int. Cl.
  H01L 23/29 (2006.01)
  H01L 23/12 (2006.01)
  H01L 23/06 (2006.01)
  H01L 23/04 (2006.01)

(52) U.S. Cl. .................... 257/790; 257/704; 257/729; 257/730; 257/788; 257/E23.126; 257/E23.128; 257/E23.182; 257/E23.183; 257/E23.188; 257/E23.193; 257/E23.194

(58) Field of Classification Search ................. 257/704, 257/729–730, 788, 790, E23.126, E23.128, 257/E23.182, E23.183, E23.188, E23.193, 257/E23.194
See application file for complete search history.

(56) References Cited

U.S. PATENT DOCUMENTS

| 6,844,621 | B2 * | 1/2005 | Morozumi et al. ........... 257/700 |
| 7,045,827 | B2 * | 5/2006 | Gallup et al. ................. 257/98 |
| 7,154,173 | B2 * | 12/2006 | Ikeda et al. .................. 257/704 |
| 7,381,583 | B1 * | 6/2008 | Ebel et al. ....................... 438/53 |
| 7,508,064 | B2 * | 3/2009 | Martin et al. ............... 257/704 |
| 7,528,481 | B2 * | 5/2009 | Kim et al. .................... 257/704 |
| 2005/0189621 | A1 * | 9/2005 | Cheung ..................... 257/619 |

FOREIGN PATENT DOCUMENTS

JP  08-070061  3/1996

* cited by examiner

*Primary Examiner*—Ida M Soward
(74) *Attorney, Agent, or Firm*—Young & Thompson (57) ABSTRACT

Aiming at providing a semiconductor device advanced in performance of transistors, and improved in reliability, a semiconductor device of the present invention has a semiconductor element, a frame component provided over the semiconductor element, while forming a cavity therein, and a molding resin layer covering around the frame component, wherein the frame component is composed of a plurality of resin films (a first resin film and a second resin film) containing the same resin, and the cavity allows the active region of the semiconductor element to expose therein.

4 Claims, 7 Drawing Sheets

SEMICONDUCTOR DEVICE AND METHOD OF MANUFACTURING THE SAME

This application is based on Japanese patent application No. 2007-194127 the content of which is incorporated hereinto by reference.

BACKGROUND

1. Technical Field

The present invention relates to a semiconductor device having a semiconductor element packaged therein, and a method of manufacturing the same.

2. Related Art

Minimization of influences of parasitic capacitance may be an effective means for improving performances of transistors. For this purpose, various techniques of reducing the parasitic capacitance, based on covering an active region of a chip using a material having a lower dielectric constant, have been proposed.

For example, a semiconductor device described in Japanese Laid-Open Patent Publication No. H8-070061 has, on an integrated circuit substrate having a semiconductor element mounted thereon, a micro wall of a certain height, risen up on the integrated circuit substrate in the normal direction so as to surround the semiconductor element. The micro wall is composed of an insulating material, electroconductive material, or the like. Space surrounded by the micro wall is closed by a micro lid, so as to form a cavity therein. The micro lid is composed of an electroconductive material.

Japanese Laid-Open Patent Publication No. H8-070061 describes that the above-described configuration allows protection of the semiconductor elements without causing degradation in electrical characteristics of the integrated circuit, because a resin used for encapsulation by potting will never be brought into contact with the semiconductor element and signal lines in the cavity, and that high-frequency integrated circuit may be obtained at low costs.

However, the conventional technique described in Japanese Laid-Open Patent Publication No. H8-070061 still had a room of improvement in the aspects below.

First, the micro lid and micro wall, containing an electroconductive material, may possibly be brought into contact with wire provided so as to contact with electrode pads on the element, to thereby cause electrical short circuiting.

Second, the micro wall and the micro lid have occasionally resulted in separation at the joint portion, if they had different values of linear coefficient of expansion. The molding resin may therefore enter the space, and may give damage to the active region.

Third, the active region has occasionally cause physical or chemical damage when the micro lid is fixed to the top of the micro wall by methods of bonding such as soldering, heat cladding, ultrasonic cladding and welding, and thereby yield ratio of products has occasionally degraded.

SUMMARY

In one embodiment, there is provided a semiconductor device which includes a semiconductor element; a frame component provided over the semiconductor element, while forming a cavity therein; and a molding resin layer covering around the frame component; wherein the frame component is composed of a plurality of resin films containing the same resin, and the cavity allows the active region of the semiconductor element to expose therein.

Because the frame component in the present invention is composed of the resin films, electrical short circuiting may be suppressed.

In the present invention, the active region of the semiconductor element exposes in the cavity. By virtue of this configuration, influences of parasitic capacitance may be reduced, and thereby transistors may be improved in performance.

In the present invention, the frame component is composed of a plurality of resin films containing the same resin. By virtue of this configuration, thermal stress possibly exerted to the frame component in the process of manufacturing may be suppressed, and fracture of the frame component may consequently be suppressed. Therefore, intrusion of the molding resin and so forth into the cavity may be suppressed, and thereby reliability of products may improve. As is clear from the above, the semiconductor device of the present invention has a structure excellent in stability of manufacturing.

In one embodiment, there is provided also a method of manufacturing a semiconductor device which includes forming a coated film, by coating a liquid resin composition so as to cover a semiconductor element; forming a first resin film risen up so as to surround an active region of the semiconductor element, by patterning the coated film; forming a frame component having a cavity therein, by placing a second resin film so as to cover the semiconductor element, cladding the second resin film to the top end portion of the first resin film, and thereby tightly closing the space surrounded by the first resin film; and forming a molding resin layer so as to cover around the frame component.

The method of manufacturing a semiconductor device has a process step of forming the frame component by cladding the second resin film on the top end portion of the first resin film to thereby form the frame component having a cavity therein. Because the common resin films are bonded, it is no more necessary to bond them using solder or ultrasonic wave, so that damages to the active region may be suppressed, and yield ratio of products may be improved.

According the present invention, there is provided a semiconductor device improved in performance of transistors, and a method of manufacturing a semiconductor device improved in yield ratio of products.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to illustrative embodiments. Those skilled in the art will recognize that many alternative embodiments can be accomplished using the teachings of the present invention and that the invention is not limited to the embodiment illustrated for explanatory purposes.

Paragraphs below will describe embodiments of the present invention, referring to the attached drawings. In all drawings, any similar constituents will be given with similar reference numerals, so as to avoid repetitive explanation.

Figure 1:
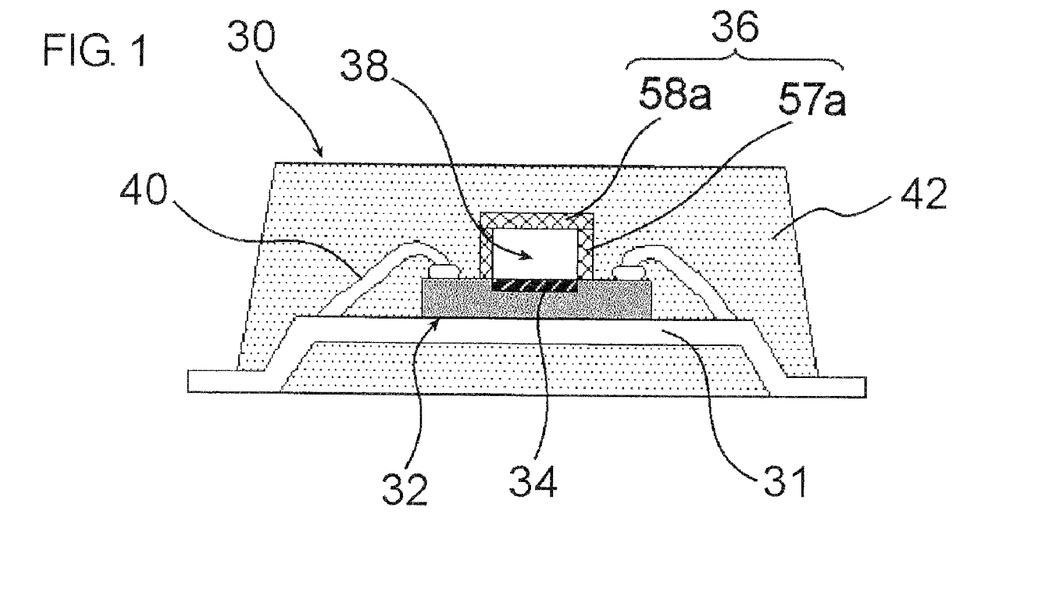
FIG. 1 is a sectional view schematically showing a semiconductor device according to the first embodiment.

A semiconductor device of the first embodiment will be explained referring to a sectional view shown in FIG. 1. FIG. 1 shows an exemplary case where a semiconductor device is placed on a lead frame.

As shown in FIG. 1, a semiconductor device 30 has a semiconductor element 32, a frame component 36 provided over the semiconductor element 32 while forming a cavity 38 therein, and a molding resin layer 42 covering around the frame component 36. Electrode pads of the semiconductor element 32 are electrically connected via wires 40 to a lead frame 31.

The frame component 36 has a hollow structure composed of a first resin film 57a provided as being risen up around an active region 34 of the semiconductor element 32, and a second resin film 58a tightly closing the space surrounded by the first resin film 57a. As shown in FIG. 3B, given as a partially enlarged view of the frame component 36, the thickness "a" of the first resin film 57a is approximately 5 to 50 μm, and the height "b" is approximately 10 to 1500 μm. The thickness "c" of the second resin film 58a is approximately 5 to 30 μm.

The first resin film 57a and the second resin film 58a are composed of resin films containing the same resin.

This sort of resin may contain a resin curable by heat and light.

Resins having a photo-reactive group such as vinyl group, and additionally having a heat-reactive group such as epoxy group, may be used as the resin curable by heat and light.

A method of manufacturing a semiconductor device according to this embodiment will be explained below.

FIGS. 2A to 2C and FIGS. 3A and 3B are sectional views showing process steps of manufacturing according to this embodiment. FIGS. 4A to 4C a (c) are plan views showing process steps of manufacturing according to this embodiment.

It is to be noted that FIGS. 2A to 4C show only a part of the semiconductor element 32 for the convenience of explaining the process steps of manufacturing, apart from real processes proceeded on a wafer.

Figure 2A:
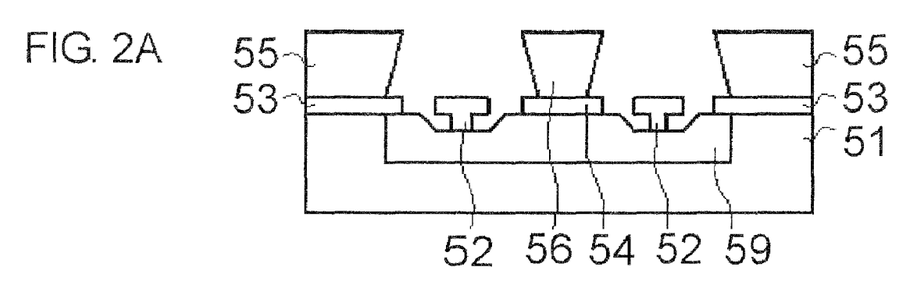
FIGS. 2A to 2C and FIGS. 3A and 3B are sectional views schematically showing process steps of manufacturing a semiconductor device according to the first embodiment.

First, as shown in FIG. 2A and FIG. 4A, an active region 59 is formed in the surficial portion of a semiconductor substrate 51 having an operative semiconductor layer. Portions other than the active region 59 are given as semi-insulating regions by mesa etching or the like.

The semiconductor substrate 51 has a low-resistivity layer formed in the most surficial portion thereof. A part of the low-resistivity layer is removed, so as to form recesses. On the surface of each recess, so-called, T-shape gate electrodes (or mushroom-shape gate electrode) 52, having a structure aimed at limiting the dimension in the direction of current flow (gate length) while reducing resistivity by expanding the dimension of the top portion in the direction of current flow, are formed. The number of lines and length of the gate electrodes are appropriately selected depending on applications. This embodiment explains an exemplary case of using a paired gate electrode compose of two lines. On the low-resistivity layer, source electrodes 53 and a drain electrode 54 are formed so as to locate the pair of gate electrodes 52 in between.

A source extraction interconnect 55 is then formed on the source electrodes 53 typically by plating. A drain extraction interconnect 56 is then formed on the drain electrode 54.

FIG. 4A schematically shows a planar configuration of the gate electrodes 52, source extraction interconnects 55, a drain extraction interconnect 56, and the active region 59.

Figure 2B:
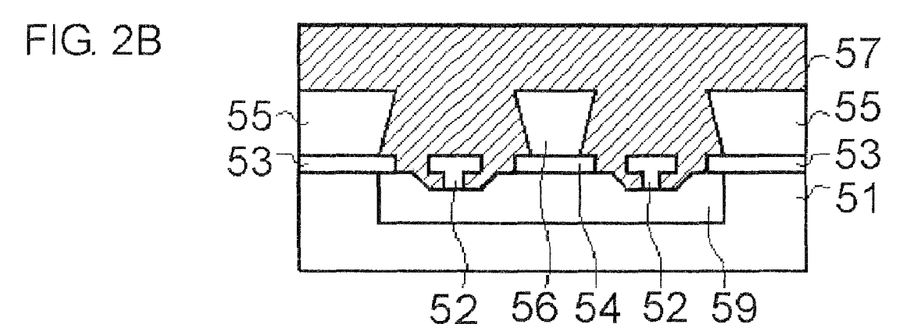

Next, as shown in FIG. 2B, a liquid resin composition is coated over the entire surface of the wafer to as thick as 5 to 1500 μm, so as to form a coated film 57. The coated film 57 may be formed using a liquid resin composition containing a resin curable by heat and light. More specifically, TMMR S2000 (from Tokyo Ohka Kogyo Co., Ltd.), for example, may be adoptable.

Figure 2C:
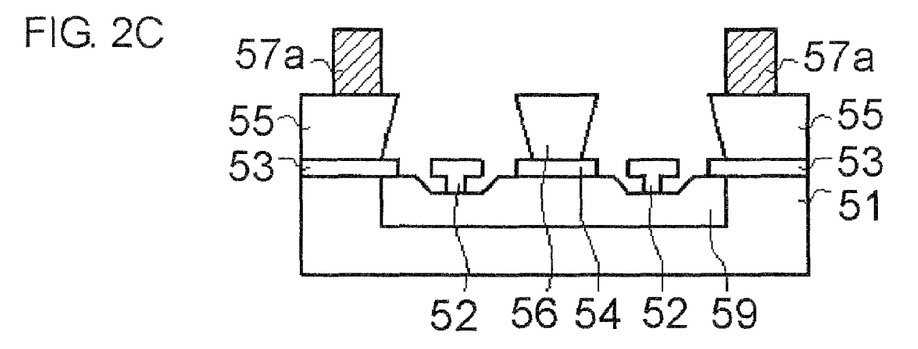

The coated film 57 is then subjected to light exposure and development, so as to form a first resin film 57a as shown in FIG. 2C. In this embodiment, unexposed portion is removed. The first resin film 57a is then hardened by baking at approximately 200° C. for 60 minutes or around.

A planar configuration seen in this stage is schematically shown in FIG. 4B. A pattern is formed by thus hardened first resin film 57a, so as to surround the active region 59. A part of the hardened first resin film 57a is formed on a protective insulating film which resides on the semiconductor substrate.

Figure 3A:
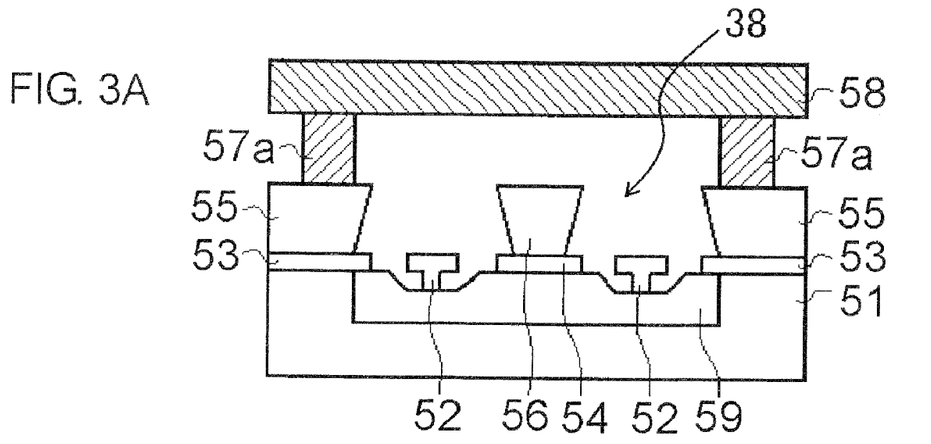
Figure 3B:
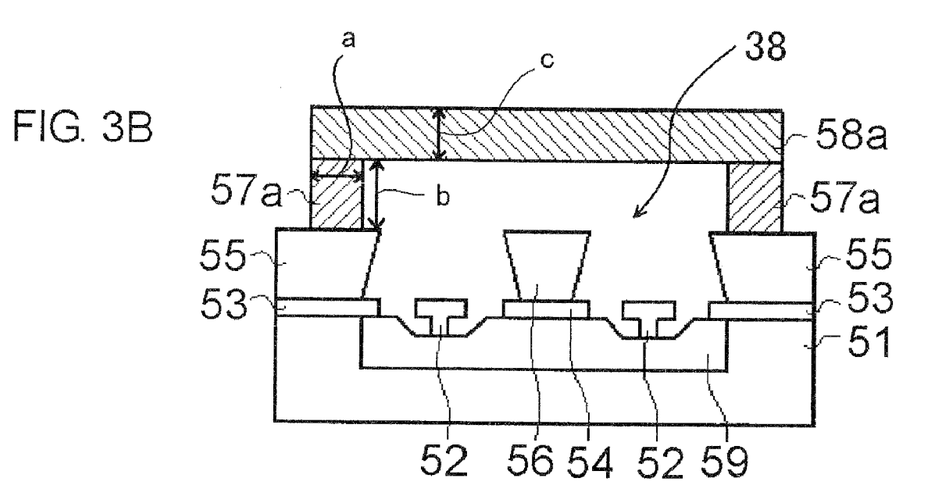
Figure 4A:
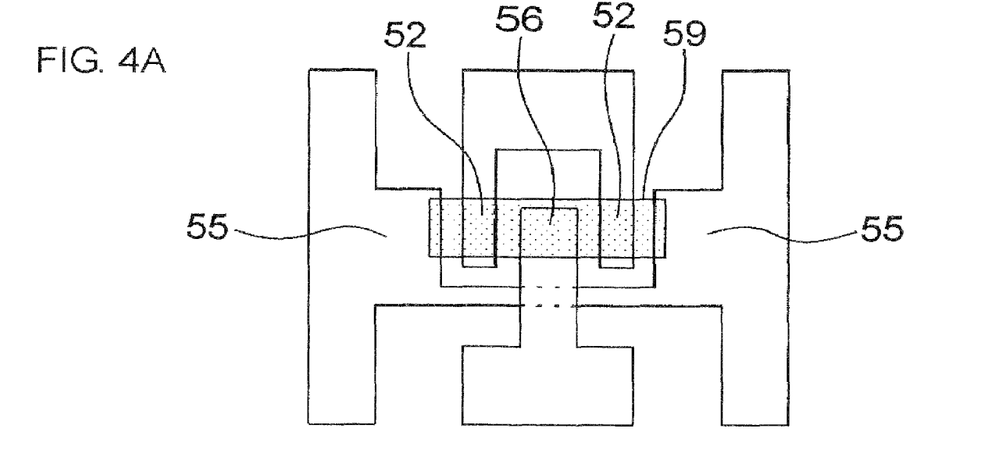
FIGS. 4A to 4C are plan views schematically showing process steps of manufacturing a semiconductor device according to a first embodiment.
Figure 4B:
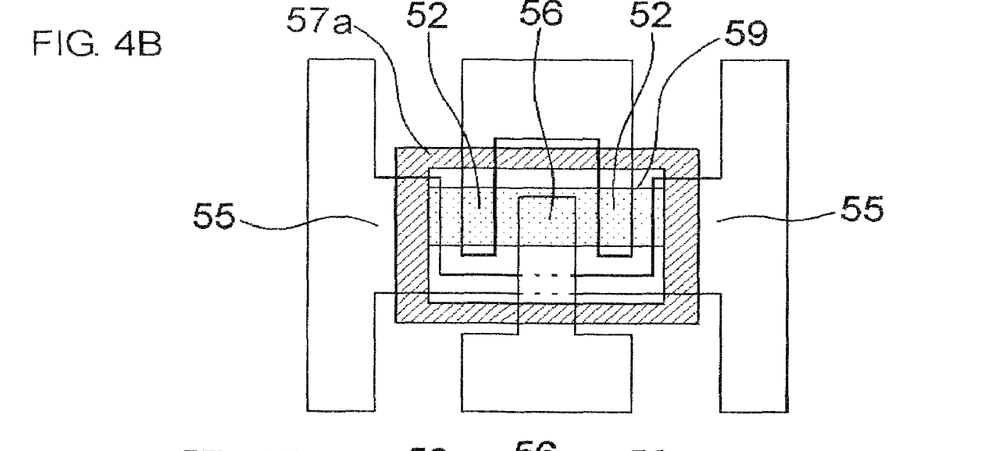
Figure 4C:
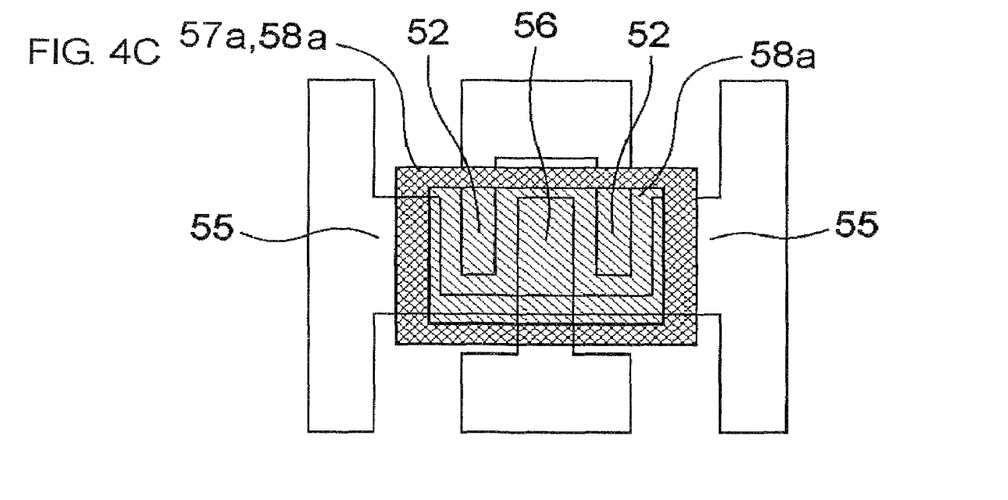

Next, as shown in FIG. 3A, a sheet-like photosensitive second resin film 58 of 15 to 30 μm thick is placed so as to cover the entire surface of the wafer, and is then cladded to the top end portion of the first resin film 57a. The space surrounded by the first resin film 57a is tightly closed in this way, so as to form the cavity 38.

The second resin film 58 contains the above-described resin curable by heat and light. As the second resin film 58, TMMF S2000 (from Tokyo Ohka Kogyo Co., Ltd.), for example, may be adoptable.

Cladding may be proceeded by allowing a roller to roll under pressure on the sheet-like second resin film 58, from one end towards the opposite end of the wafer. Force of pressurizing of the roller is 0.1 to 1.0 MPa or around.

The second resin film 58 is then cut in circle conforming to the contour of the wafer, by laser or mechanical technique. The second resin film 58 is then exposed to light and developed, so as to form the second resin film 58a, as shown in FIG. 3B. In this embodiment, unexposed portion is removed. The second resin film 58 is then hardened by baking at approximately 200° C. for 60 minutes.

Because the first resin film 57a and the second resin film 58a bonded herein contain basically the same material as described in the above, they may more tightly be bonded and integrated, by hardening under the conditions described in the above. A planar configuration seen in this stage is schematically shown in FIG. 4C.

As shown in FIG. 3B, the cavity 38 is formed by the first resin film 57a and the second resin film 58a. Field effect transistors are thus formed, the wafer is then pelletized by dicing or the like, and the resultant pellet is then molded and packaged using a resin by a publicly-known technique (FIG. 1). This embodiment shows an exemplary case of forming the wall using an epoxy resin so as to surround the active region, whereas the wall, composing a package, may be disposed in any way so far as it can block intrusion of the molding resin to the active region.

Effects of this embodiment will be explained below.

In this embodiment, the active region 34 of the semiconductor element 32 exposes in the cavity 38. Accordingly, influences of parasitic capacitance may be reduced, and thereby the transistors may be improved in performances.

In this embodiment, the frame component 36 is composed of a plurality of resin films containing the same resin.

Accordingly, thermal stress possibly exerted to the frame component 36 in the process of manufacturing may be reduced, and thereby fracture of the frame component 36 may be suppressed. Intrusion of the molding resin or the like into the cavity 38 may therefore be suppressed, and reliability of products may consequently be improved. As is clear from the above, the semiconductor device of the present invention has a structure ensuring stability of manufacturing.

In addition, the frame component 36 contains the first resin film 57*a* provided as being risen up around the active region 34 of the semiconductor element 32, and the second resin film 58*a* tightly closing the space surrounded by the first resin film 57*a*. Because the frame component 36 is composed of the resin films, physical or chemical damages otherwise possibly be exerted to the active region 34 may be suppressed, and thereby the semiconductor device may be improved in stability of manufacturing, and yield ratio of products.

On the other hand, in the semiconductor device described in Japanese Laid-Open Patent Publication No. H8-070061, the micro wall and the micro lid are provided by bonding different materials or as being integrated using an electroconductive material. The bonding has occasionally caused adhesion of the adhesive material to the element, and has degraded characteristics of the element. The micro wall and the micro lid containing an electroconductive material have occasionally been brought into contact with wires provided as being bonded to the electrode pads of the element, and has raised a risk of shortcircuiting.

Moreover, methods of bonding the micro wall and the micro lid containing an electroconductive material may inevitably call for soldering, heat cladding, ultrasonic cladding and welding, all of which relying upon heat and/or vibration for bonding, so that they may induce variation in characteristics of the element, and breakdown of the micro gate.

For example, soldering needs that a solder material should preliminarily be adhered, wherein the solder material may accidentally adhere to the element, and may fracture the element.

Heat cladding generally needs heating at 300° C. or around under pressure, wherein it is anticipated that a brittle GaAs substrate, for example, cannot be pressurized to a necessary and sufficient degree, and even that the element may degrade due to processing under high temperatures.

Ultrasonic cladding needs irradiation of ultrasonic wave to the portion to be bonded under pressure, wherein the process may destroy the thin gate profile, and may thereby degrade quality of the element.

Welding may damage the element, in the process of melting the material, due to temperature or the melted material.

In contrast, the semiconductor device of this embodiment is provided with the integrated wall composed of resin only, so as to prevent the molding resin forming a package from readily intruding, within a range of existing steps of compound semiconductor process, so that the above-described problems may be solved, and is thereby given with a structure excellent in stability of manufacturing.

In the semiconductor device of this embodiment, the first resin film 57*a* and the second resin film 58*a* are cured by heat and light.

Accordingly, the resin films may be molded to give a desired geometry by irradiation of light, and at the same time, may be given with adhesiveness because the resin films are brought into the B-stage, so that the semiconductor device may have a configuration excellent in stability of manufacturing.

The method of manufacturing a semiconductor device according to this embodiment has the step of forming the frame component 36 having the cavity 38 therein, by cladding the second resin film 58 to the top end portion of the first resin film 57*a*.

As is clear from the above, there is no need of relying upon solder or ultrasonic wave for bonding commonly between the resin films, so that damages to the active region 34 may be suppressed, and yield ratio of products may be improved.

The embodiments of the present invention have been described in the above referring to the attached drawings, merely as examples of the present invention, wherein any other configurations other than those described in the above may be adoptable.

Figure 5:
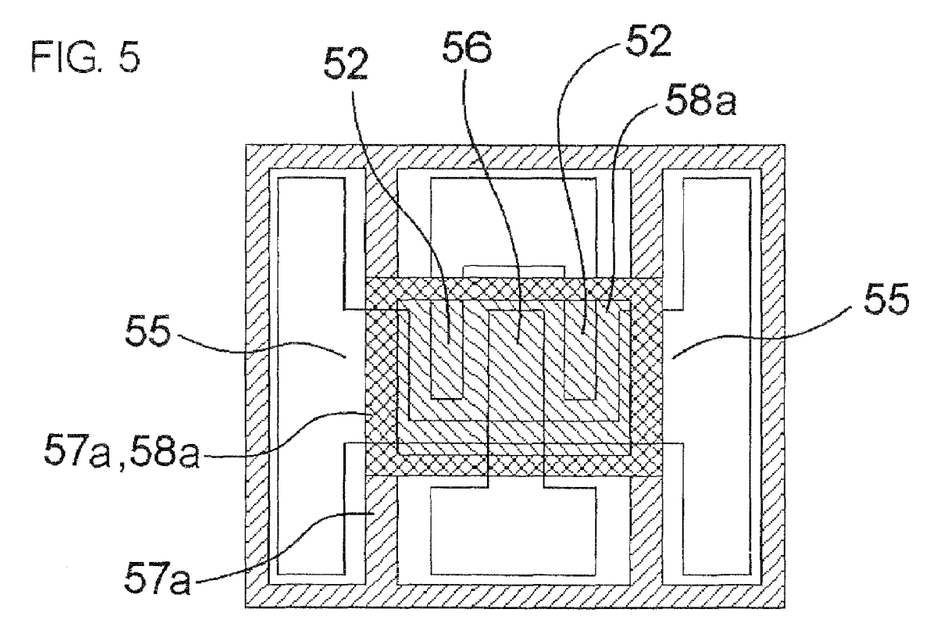
FIG. 5 is a plan view schematically showing a semiconductor device according to a second embodiment.

FIG. 5 shows a semiconductor device of a second embodiment. In this embodiment, the first resin film 57*a* is left unremoved not only around the gate, but also around the pads. This configuration raises an advantage in that the cavity may be formed in a stable manner, when the photosensitive sheet-like second resin film 58 is bonded.

Figure 6:
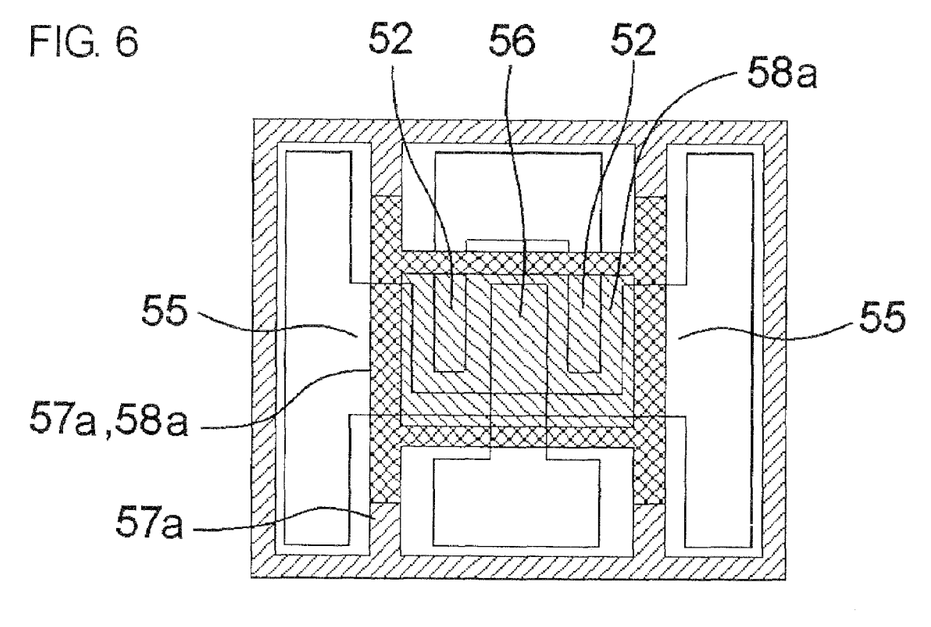
FIG. 6 is a plan view schematically showing a semiconductor device according to a third embodiment.

FIG. 6 shows a semiconductor device of a third embodiment. In this embodiment, contact area between the first resin film 57*a* and the second resin film 58*a* is increased as compared with that in the second embodiment. By virtue of this configuration, adhesiveness between the resins may be made stronger, and thereby yield ratio of the semiconductor device may be improved.

Figure 7:
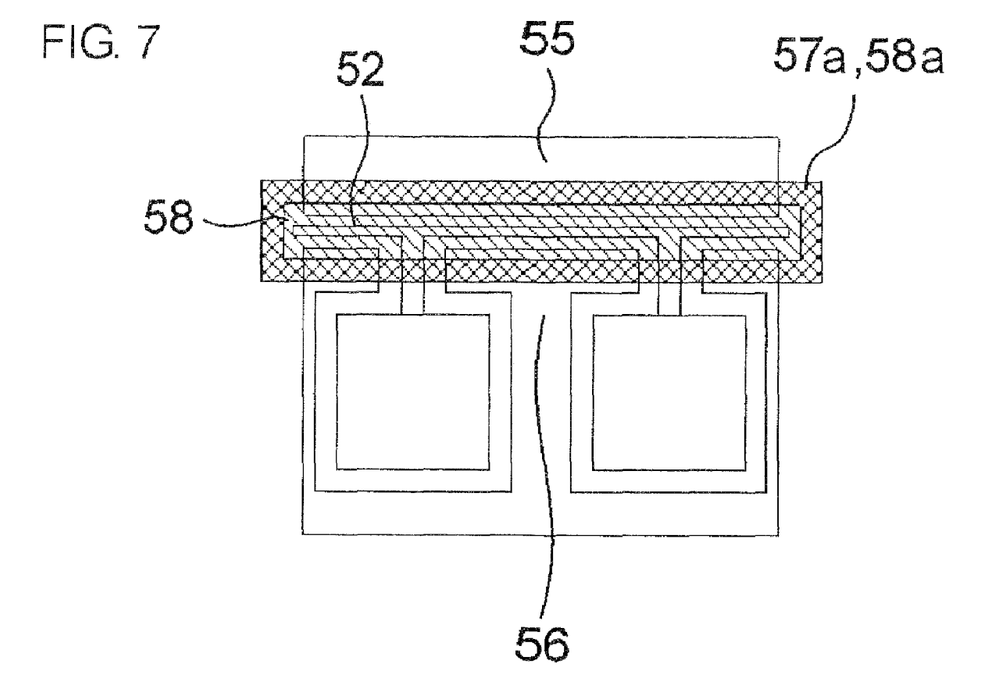
FIG. 7 is a plan view schematically showing a semiconductor device according to a fourth embodiment.

FIG. 7 shows a semiconductor device of a fourth embodiment. Although this embodiment has a structure different in arrangement of the gates, sources and drain from those in the first to third embodiments, the active region 34 may be covered with the frame component 36 having the cavity 38 therein, by a similar method of manufacturing.

It is apparent that the present invention is not limited to the above embodiment, that may be modified and changed without departing from the scope and spirit of the invention.

What is claimed is:

1. A semiconductor device comprising:
 a semiconductor element;
 a frame component provided over said semiconductor element, while forming a cavity therein; and
 a molding resin layer covering around said frame component;
 wherein said frame component is composed of a plurality of resin films containing the same resin, and
 said cavity allows the active region of said semiconductor element to expose therein.

2. The semiconductor device as claimed in claim 1,
 wherein said frame component contains a first resin film risen up so as to surround said active region of said semiconductor element; and
 a second resin film provided as a lid component tightly closing the space, surrounded by said first resin film, from the top.

3. The semiconductor device as claimed in claim 1,
 wherein said first and second resin films are composed of a resin curable by heat and light.

4. The semiconductor device as claimed in claim 1,
 wherein said resin films contain an epoxy resin.

\* \* \* \* \*